(12) United States Patent
Jäger et al.

(10) Patent No.: US 10,847,503 B2
(45) Date of Patent: Nov. 24, 2020

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Claus Jäger, Regensburg (DE); Thomas Kippes, Neumarkt (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/374,486

(22) Filed: Apr. 3, 2019

(65) Prior Publication Data
US 2019/0312017 A1    Oct. 10, 2019

(30) Foreign Application Priority Data
Apr. 4, 2018  (DE) .................. 10 2018 107 956

(51) Int. Cl.
| H01L 25/16 | (2006.01) |
| H01L 23/31 | (2006.01) |
| G02B 27/09 | (2006.01) |

(52) U.S. Cl.
CPC ........ H01L 25/167 (2013.01); G02B 27/0977 (2013.01); H01L 23/3121 (2013.01)

(58) Field of Classification Search
CPC ............ G02B 27/0977; H01L 23/3121; H01L 25/167

USPC .......................................................... 257/98
See application file for complete search history.

(56) References Cited

U.S. PATENT DOCUMENTS

| 4,767,172 A * | 8/1988 | Nichols ................. F21V 7/0091 |
| | | 355/1 |
| 2004/0207999 A1* | 10/2004 | Suehiro ................ G02B 6/0018 |
| | | 362/84 |
| 2006/0098308 A1* | 5/2006 | Angelini ................... F21V 3/04 |
| | | 359/820 |

* cited by examiner

*Primary Examiner* — Tong-Ho Kim
(74) *Attorney, Agent, or Firm* — Arent Fox LLP (57) ABSTRACT

The invention relates to an optoelectronic component comprising
  at least one optoelectronic semiconductor chip which is designed to generate or detect electromagnetic radiation,
  a carrier on which the semiconductor chip is arranged,
  a first encapsulation body into which the optoelectronic semiconductor chip is embedded, and
  a second encapsulation body, wherein
  the first encapsulation body has a first thickness above the semiconductor chip and has a second thickness laterally spaced from the semiconductor chip,
  the first thickness is less than the second thickness,
  a third thickness of the first encapsulation body between the first thickness and the second thickness is minimal, and
  the second encapsulation body is arranged on the first encapsulation body.

15 Claims, 4 Drawing Sheets

OPTOELECTRONIC COMPONENT AND METHOD FOR PRODUCING AN OPTOELECTRONIC COMPONENT

The present application claims the priority of German patent application no. 10 2018 107 956.7 which was submitted to the German Patent and Trade Mark Office on Apr. 4, 2018, and the disclosure content of which is hereby incorporated into the present application.

The invention relates to an optoelectronic component. The invention also relates to a method for producing an optoelectronic component.

One object to be achieved is to specify an optoelectronic component which is particularly stable mechanically. Another object to be achieved is to specify a method for producing such an optoelectronic component.

The invention relates to an optoelectronic component. The optoelectronic component is, for example, a radiation-emitting component which emits electromagnetic radiation, in particular visible light, during operation. For example, the radiation-emitting component is a light-emitting diode. Alternatively, it is possible for the optoelectronic component to be a radiation-detecting component which detects electromagnetic radiation during operation. For example, the radiation-detecting component is a photodiode.

According to at least one embodiment, the optoelectronic component comprises at least one optoelectronic semiconductor chip which is designed to generate or detect electromagnetic radiation. At least one semiconductor chip is, for example, designed to generate electromagnetic radiation during operation, for example, to generate near-ultraviolet radiation, visible light and/or near-infrared radiation. Alternatively, it is possible for at least one semiconductor chip to be designed to detect electromagnetic radiation. Furthermore, it is possible for the optoelectronic component to comprise radiation-emitting and radiation-detecting semiconductor chips.

If at least one optoelectronic semiconductor chip is designed to generate electromagnetic radiation, it can be a surface emitter in which the emitted radiation exits mostly, for example, over 80% of the radiated power, via a radiation exit surface formed by a main surface of at least one semiconductor chip.

Furthermore, at least one optoelectronic semiconductor chip can be a volume-emitting radiation-emitting semiconductor chip which emits the emitted radiation not only via a single main surface but also via at least one side surface running transversely to the main surface. For example, in the case of a volume emitter, at least 30% of the radiated power of the emitted radiation exits through at least one side surface.

Furthermore, it is possible for the radiation-emitting semiconductor chip to have a conversion layer which, for example, converts primary electromagnetic radiation emitted by the semiconductor chip into secondary electromagnetic radiation. The conversion layer comprises, for example, a matrix material into which fluorescent particles are introduced. The matrix material can be, for example, a resin, such as an epoxy or a silicone or a mixture of these materials, or a ceramic material. The fluorescent particles impart the wavelength-converting properties to the conversion layer.

According to at least one embodiment, the optoelectronic component comprises a carrier on which at least one semiconductor chip is arranged. The carrier may be in electrically conductive contact with at least one semiconductor chip. In addition, at least one semiconductor chip may be in direct and immediate contact with the carrier. The carrier is, for example, made of a metallic and/or ceramic material or consists thereof. The carrier is or comprises, for example, a printed circuit board (PCB) or a lead frame.

The carrier has a main plane of extension, for example. The vertical direction extends perpendicularly to the main plane of extension and the lateral directions extend in parallel to the main plane of extension.

According to at least one embodiment, the optoelectronic component comprises a first encapsulation body into which the optoelectronic semiconductor chip is embedded. In this case, the term "embedded" may in this case mean that at least one semiconductor chip is located partially within the first encapsulation body and/or is surrounded by the first encapsulation body on at least part of its outer surface. The first encapsulation body preferably completely surrounds the semiconductor chip. In this case, the first encapsulation body surrounds the outer surfaces of the semiconductor chip which are not in contact with the carrier. The first semiconductor chip can be in direct and immediate contact with the first encapsulation body.

Furthermore, the first encapsulation body may completely cover a top surface of the carrier on which the semiconductor chip is arranged. In this case, the carrier can be in direct and immediate contact with the first encapsulation body.

According to at least one embodiment, the optoelectronic component comprises a second encapsulation body. The first encapsulation body and the second encapsulation body are transmissive, for example, transparent to the radiation emitted by the optoelectronic semiconductor chip or to radiation to be detected. Alternatively, it is possible for the first encapsulation body and the second encapsulation body to be transmissive, for example, transparent to the radiation to be detected by at least one radiation-detecting semiconductor chip. The first encapsulation body and the second encapsulation body are formed of, for example, a plastic, such as a silicone, an epoxy, or an epoxy hybrid material.

According to at least one embodiment, the first encapsulation body has a first thickness above the semiconductor chip and has a second thickness laterally spaced from the semiconductor chip. The thickness is a distance between two opposite outer surfaces of the first encapsulation body in the vertical direction.

For example, the first encapsulation body has a first thickness in a first region. In this case, the semiconductor chip completely overlaps the first region in the plan view. Laterally spaced from the first region, the first encapsulation body has a second region with the second thickness. In this case, the first region and the second region do not adjoin each other, for example, and are in particular not in direct or immediate contact with one another. Instead, at least one further region of the encapsulation body can be arranged between the two regions.

According to at least one embodiment, the first thickness is less than the second thickness. For example, a distance between the opposite outer surfaces of the first encapsulation body in the vertical direction is greater in the second region than in the first region.

According to at least one embodiment, a third thickness of the first encapsulation body between the first thickness and the second thickness is minimal. This means that in a third region arranged between the first region and the second region, the distance between the opposite outer surfaces of the first encapsulation body is smaller than the distance in the first and second region. The third region is, for example, laterally spaced from the semiconductor chip. This means that, in the plan view, the semiconductor chip and the third region do not overlap.

An outer surface of the first encapsulation body facing away from the carrier may respectively extend transversely to the main plane of extension and/or be curved in the first region, in the second region and in the third region. The outer surface of the first encapsulation body facing away from the carrier can have a shape of a wedge or of a blunt wedge in the third region in cross section along a sectional plane running perpendicularly to the main plane of extension. The wedge or the blunt wedge may have at least one side surface that is curved. A tip of the wedge or a stump of the wedge points toward the carrier and forms a minimum of the thickness of the first encapsulation body. The first encapsulation body can, in this case, completely cover the carrier and the optoelectronic semiconductor chip.

According to at least one embodiment, the second encapsulation body is arranged on the first encapsulation body. The second encapsulation body covers the first encapsulation body in regions, for example. The outer surface of the second encapsulation body facing away from the carrier may project beyond the outer surface of the first encapsulation body or be flush with it. It is also possible for the outer surface of the second encapsulation body facing away from the carrier to not project beyond the outer surface of the first encapsulation body in regions.

In at least one embodiment, the optoelectronic component comprises at least one optoelectronic semiconductor chip which is designed to generate or detect electromagnetic radiation, a carrier on which the semiconductor chip is arranged, a first encapsulation body in which the optoelectronic semiconductor chip is embedded, and a second encapsulation body. The first encapsulation body has a first thickness above the semiconductor chip and has a second thickness laterally spaced from the semiconductor chip. The first thickness is less than the second thickness. A third thickness of the first encapsulation body between the first thickness and the second thickness is minimal and the second encapsulation body is arranged on the first encapsulation body.

The optoelectronic component described here inter alia makes use of the idea of using two different refractive indices for two transparent encapsulation bodies in order to realize a total inner reflection lens ("TIR lens" for short).

Currently, semiconductor chips are embedded in encapsulation bodies which, for example, have a lens shape in order to deflect the generated electromagnetic radiation into a desired direction. Among other things, reflective diffusing materials, such as $TiO_2$ particles, are used to increase light extraction from a radiation passage surface.

One idea of the optoelectronic component described here is, inter alia, to embed the semiconductor chip into a first encapsulation body and to arrange, in particular monolithically, a second encapsulation body on the first encapsulation body. The optoelectronic component is advantageously particularly mechanically stable due to this connection. The first encapsulation body preferably has a smaller refractive index than the second encapsulation body. The two encapsulation bodies thus form a total inner reflection lens and thus increase the light extraction from the radiation passage surface.

According to at least one embodiment, the first encapsulation body has a concavely or convexly shaped, i.e. a curved, outer surface above the semiconductor chip. The outer surface is, for example, the outer surface of the first encapsulation body facing away from the carrier in the first region. Since the first encapsulation body can be in direct contact with the second encapsulation body in the first region, the outer surface of the second encapsulation body facing toward the carrier is, for example, correspondingly convexly or concavely shaped in the first region.

An optical axis of the optoelectronic component can extend in the vertical direction, wherein the concavely or convexly shaped outer surface of the first encapsulation body and of the second encapsulation body are arranged symmetrically, in particular rotationally symmetrically, around the optical axis. The optical axis of the optoelectronic component in particular extends in a direction that corresponds to a maximum emission intensity. Furthermore, the optical axis passes through a radiation passage surface of the optoelectronic component which is arranged opposite the carrier.

Furthermore, an angle may be enclosed between the main plane of extension and the optical axis. In other words, a direction of the maximum emission intensity of the optoelectronic component is tilted relatively to the main plane of extension.

The angle is, for example, at most 88°, in particular at most 86°, or preferably at most 84°. Alternatively or additionally, this angle is at least 45°, in particular at least 60°, or preferably at least 75°.

According to at least one embodiment, the third thickness of the first encapsulation body is less than a thickness of the semiconductor chip. In particular, the outer surface of the first encapsulation body facing away from the carrier is arranged in the region of the minimum of the thickness of the first encapsulation body below a top surface of the semiconductor chip facing away from the carrier. This means that the outer surface of the first encapsulation body facing away from the carrier has a smaller distance from the carrier in regions in the third region than the top surface of the semiconductor chip.

If the radiation-emitting semiconductor chip is, for example, a surface-emitting semiconductor chip, the emitted radiation which is emitted at an obtuse angle to the main plane of extension can enter the second encapsulation material.

If the radiation-emitting semiconductor chip is, for example, a volume-emitting semiconductor chip, the outer surface of the first encapsulation body facing away from the carrier can be planar with a bottom surface of the semiconductor chip facing toward the carrier in the region of the minimum of the thickness of the first encapsulation body. Thus, the radiation emitted from at least one side surface of the semiconductor chip can also enter the second encapsulation body.

According to at least one embodiment, the second encapsulation body is in direct contact with the first encapsulation body in regions. In particular, the outer surface of the second encapsulation body facing toward the carrier is in direct and immediate contact with the outer surface of the first encapsulation body facing away from the carrier in the first region and completely in the third region and in regions in the second region. Alternatively, it is possible that the outer surface facing away from the carrier is completely covered by the second encapsulation body and is in direct and immediate contact therewith.

According to at least one embodiment, the refractive index of the first encapsulation body differs from the refractive index of the second encapsulation body. The refractive index of the second encapsulation body is preferably greater than the refractive index of the first encapsulation body. The refractive index of the second encapsulation body is, for example, in the range of at least 0.3 to at most 0.5 greater than the refractive index of the first encapsulation body. Alternatively, it is possible that the refractive index of the first encapsulation body is greater than the refractive index of the second encapsulation body. For example, the refractive index of the first encapsulation body is 0.5 more than the refractive index of the second encapsulation body.

If the refractive index of the second encapsulation body is, for example, greater than the refractive index of the first encapsulation body, a large portion of the emitted radiation that entered the second encapsulation body may be reflected toward the optical axis at an interface of the first encapsulation body and the second encapsulation body. The refractive index difference advantageously reduces a critical angle of total reflection. This means that the radiation emitted at an obtuse angle to the main plane of extension is advantageously reflected toward the optical axis and thus increases the light extraction through the radiation passage surface.

If the semiconductor chip is a radiation-detecting semiconductor chip, the radiation to be detected enters the second encapsulation body via the radiation passage surface and a large portion of the radiation can be reflected toward the radiation-detecting semiconductor chip in the second region at the interface of the first encapsulation body and the second encapsulation body.

According to at least one embodiment, the second encapsulation body has a first thickness above the semiconductor chip and has a second thickness laterally spaced from the semiconductor chip. The thickness is a distance between two opposite outer surfaces of the second encapsulation body in the vertical direction.

According to at least one embodiment, the first thickness of the second encapsulation body is greater than the second thickness of the second encapsulation body. For example, a distance between the opposite outer surfaces of the second encapsulation body in the vertical direction is less in the second region than in the first region.

According to at least one further embodiment, a third thickness of the second encapsulation body between the first thickness and the second thickness is maximal. This means that, in a third region arranged between the first region and the second region, the distance between the opposite outer surfaces of the second encapsulation body is greater than the distance in the first and second region. The third region is, for example, laterally spaced from the semiconductor chip. This means that, in the plan view, the semiconductor chip and the third region do not overlap.

Since the second encapsulation body is in direct contact with the first encapsulation body in the first region, in the second region and in regions in the third region, the outer surface of the second encapsulation body facing toward the carrier can correspondingly run transversely to the main plane of extension and/or be curved.

The outer surface of the second encapsulation body facing toward the carrier may have a shape of a wedge or of a blunt wedge in the third region in cross section along a sectional plane running perpendicularly to the main plane of extension in correspondence with the first encapsulation body. A tip of the wedge or a stump of the wedge points toward the carrier and forms a maximum of the thickness of the second encapsulation body.

According to at least one embodiment, the second encapsulation body has a concavely or convexly shaped outer surface above the semiconductor chip. The outer surface of the second encapsulation body facing toward the carrier is correspondingly shaped concavely or convexly in the first region due to the direct contact with the first encapsulation body. The outer surface of the second encapsulation body facing away from the carrier may also be shaped concavely or convexly.

According to at least one embodiment, the first encapsulation body and the second encapsulation body form an optical lens above the semiconductor chip. Depending on the shape of the outer surfaces of the first encapsulation body and the second encapsulation body facing away from the carrier, the optical lens can be a biconvex lens, a biconcave lens, a plano-convex lens, a plano-concave lens, a concavo-convex lens or a convexoconcave lens. Moreover, the convex or concave shape of the second encapsulation body can extend in lateral directions over the first, the second and/or third region, for example.

An emission angle range can advantageously be adjusted by the shape of the optical lens. This means that by appropriately selecting the shape of the optical lens, the emitted radiation can exit the optoelectronic component through the radiation passage surface in a narrow or broad emission angle range.

According to at least one embodiment, a reflector layer is arranged in regions between the first encapsulation body and the second encapsulation body in the region of the second thickness. There, the reflector layer can be in direct and immediate contact with the first encapsulation body and the second encapsulation body in regions or completely.

For example, if the refractive index of the second encapsulation body is smaller than the refractive index of the first encapsulation body, the emitted radiation that entered the second encapsulation body can be reflected by the reflector layer toward the optical axis at an interface of the first encapsulation body and the second encapsulation body. Advantageously, the radiation emitted at an obtuse angle to the main plane of extension is reflected toward the optical axis and thus increases the light extraction through the radiation passage surface.

If the semiconductor chip is a radiation-detecting semiconductor chip, the radiation to be detected enters the second encapsulation body via the radiation passage surface and a large portion of the radiation can be reflected by the reflector layer toward the radiation-detecting semiconductor chip at the interface of the first encapsulation body and the second encapsulation body.

According to at least one embodiment, the reflector layer comprises or consists of metal. The reflector layer contains, for example, silver, aluminum, rhodium, nickel, copper or gold or consists, for example, of silver, aluminum, rhodium, nickel, copper or gold.

Furthermore, it is possible for the reflector layer to be a Bragg mirror consisting of alternately arranged layers of a high-refractive and a low-refractive material. In addition, the reflector layer can be a combination of a Bragg mirror and a metal-containing reflector layer.

According to at least one embodiment, the reflector layer is designed to reflect the electromagnetic radiation emitted or to be detected during operation of the semiconductor chip. The reflector layer preferably has a reflectivity for the electromagnetic radiation emitted or to be detected of at least 90%.

The invention also relates to a method for producing an optoelectronic component. The method is preferably suitable for producing an optoelectronic component described here. This means that an optoelectronic component described here is or can be produced with the described method. All features disclosed in conjunction with the optoelectronic component are therefore also disclosed in connection with the method and vice versa.

According to at least one embodiment, the method comprises the step of providing a carrier. The carrier may, for example, be present in combination with other similar carriers.

According to at least one embodiment, the method comprises the step of applying the optoelectronic semiconductor chip to the carrier. The carrier comprises, for example, contact surfaces which contain or consist of, for example, metal. In addition, the semiconductor chip can comprise chip contact surfaces which, for example, contain or consist of metal. The chip contact surfaces can respectively be applied to a contact surface by gluing, bonding or soldering and can be mechanically and/or electrically connected thereto. This connection fixes the semiconductor chip on the carrier. Alternatively or additionally, it is possible for a chip contact surface to be arranged on the top surface of the semiconductor chip facing away from the carrier. The chip contact surface can then, for example, be brought into electrically conductive contact with a contact surface of the carrier by means of a bonding wire.

According to at least one embodiment, the method comprises the step of applying the first encapsulation body to the carrier and to the optoelectronic semiconductor chip. In this process, the material of the first encapsulation body is, for example, provided in a flowable form. In this case, the material of the first encapsulation body is cured after application to form the first encapsulation body.

After curing, a cavity may be produced in the first encapsulation body. The cavity can, for example, be produced by removing material from the first encapsulation body. Alternatively, the cavity is produced during application of the material of the first encapsulation body. For example, the material of the first encapsulation body may be applied by means of an injection molding process.

According to at least one embodiment, the method comprises the step of applying the second encapsulation body to the first encapsulation body by means of a casting process. The material of the second encapsulation body can, for example, be provided in a flowable form. In this case, the material of the second encapsulation body is cured after application to form the second encapsulation body. For example, the material of the second encapsulation body may be applied by means of an injection molding process. In this process, the material of the second encapsulation body can be introduced into the cavity of the first encapsulation body.

Furthermore, after curing, a cavity can be produced in the second encapsulation body. The cavity can, for example, be produced by removing material from the second encapsulation body. Alternatively, the cavity is produced during application of the material of the second encapsulation body.

According to at least one embodiment, the reflection layer is applied in regions to the first encapsulation body before applying the second encapsulation body. A metallic starting layer may, for example, be applied in regions to the outer surface of the first encapsulation body facing away from the carrier. It is also possible for the starting layer to be structured by means of a laser process. Alternatively, the starting layer may also be structured by means of an etching process.

According to at least one embodiment, the reflector layer is applied by means of electroplating. For example, the thickness of the starting layer after structuring with a laser may be increased by means of electroplating. A metal layer which is designed to be reflective can then be grown on this starting layer by means of electroplating.

The optoelectronic component described here is explained below in more detail with reference to design examples and the accompanying figures.

The drawings in

Same, similar or identically acting elements are provided in the figures with the same reference numerals. The figures and the proportions of the elements illustrated in the figures to each other should not be considered to be true to scale. Rather, individual elements may be shown in an exaggeratedly large manner for better illustration and/or for better understanding.

Figure 1:
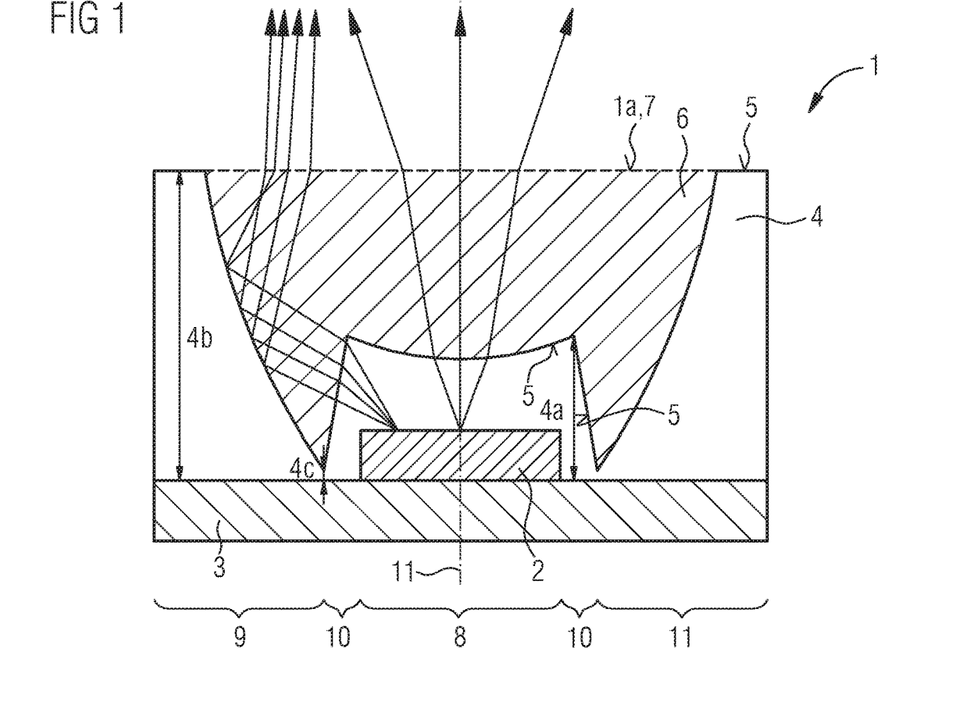
FIGS. 1, 2, 3, 4, 5 and 6 show schematic sectional views of design examples of an optoelectronic component described here, FIG. 7 schematic view of beam paths in a design example of an optoelectronic component described here, FIG. 8 schematic view of an emission characteristic of a design example of an optoelectronic component described here.

The schematic sectional view of FIG. 1 shows a design example of an optoelectronic component described here.

The optoelectronic component 1 comprises an optoelectronic semiconductor chip 2 and a carrier 3. The semiconductor chip 2, which in this embodiment is a radiation-emitting semiconductor chip 2, is arranged on the carrier 3. A first encapsulation body 4 is arranged above the carrier 3 and the semiconductor chip 2. The semiconductor chip 2 is in this case embedded into the first encapsulation body 4. In particular, the outer surfaces of the semiconductor chip 2 not covered by the carrier 3 are covered by the first encapsulation body 4 and are in direct contact therewith.

Above the semiconductor chip 2, the first encapsulation body 4 has a first thickness 4*a*. The first thickness 4*a* is defined in a first region 8. In the plan view, the semiconductor chip 2 overlaps the first region 8 completely. Laterally spaced from the first region 8, the first encapsulation body 4 has a second thickness 4*b*. The second thickness 4*b* is defined, for example, in a second region 9. In this case, the first thickness 4*a* is less than the second thickness 4*b* of the first encapsulation body 4. Between the first and the second region 8, 9 is located, for example, a third region 10 which has a third thickness 4*c* of the first encapsulation body 4. The third thickness 4*c* of the first encapsulation body 4 is, in this case, determined at the point where a distance between two opposite outer surfaces 5, 7 of the first encapsulation body 4 in the vertical direction is minimal.

A second encapsulation body 6 is arranged above the first encapsulation body 4. In this case, the first encapsulation body 4 is in direct and immediate contact with the second encapsulation body 6 in regions. The outer surfaces 5, 7 of the first encapsulation body 4 and of the second encapsulation body 6 facing away from the carrier 3 extend up to a common plane in the vertical direction and are flush with one another.

The first encapsulation body 4 has a concave profile above the semiconductor chip 2. In this case, an optical axis 11 runs in the vertical direction, wherein the concavely shaped outer surface 5 of the first encapsulation body 4 is arranged symmetrically, in particular rotationally symmetric, to the optical axis 11.

The refractive index of the second encapsulation body 6 is greater than the refractive index of the first encapsulation body 4. The emitted radiation that does not exit through the curved outer surface 5 of the first encapsulation body 4 in the first region 8, enters the second encapsulation body 6 at the outer surface 5 of the first encapsulation body 4 facing away from the carrier 3 in the third region 10.

Furthermore, the emitted radiation is reflected back into the second encapsulation body 6 at the interface of the outer surface 5 of the first encapsulation body 4 facing away from the carrier 3, in the second region 9 and in regions in the third region 10. The critical angle of total reflection is advantageously reduced by the difference in the refractive index. The reflected radiation may then exit through the radiation passage surface 1a of the optoelectronic component 1, which is formed by the outer surface 7 of the second encapsulation body 6 facing away from the carrier 3.

Figure 2:
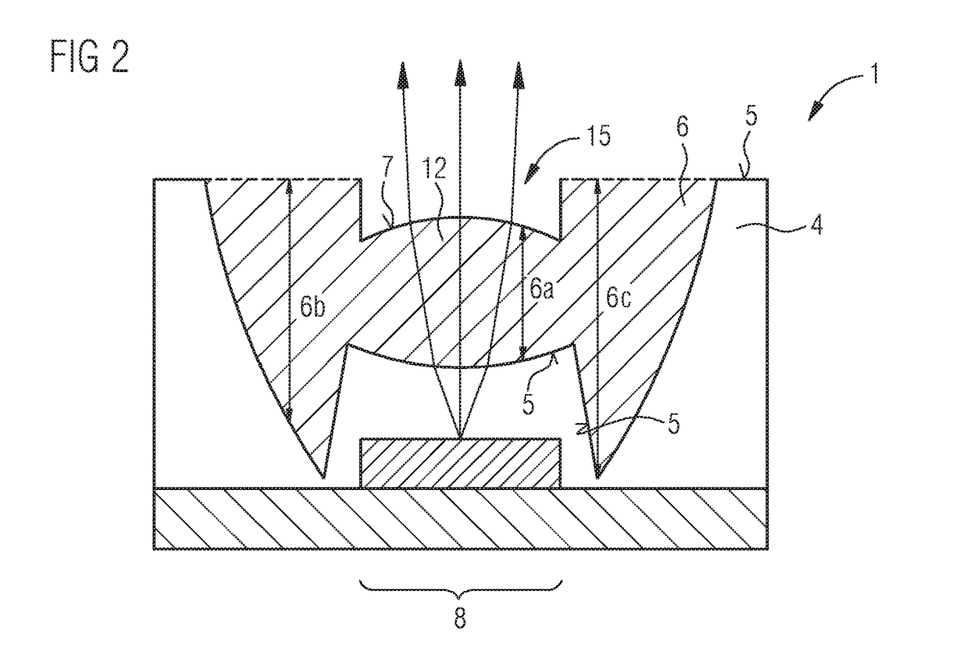

The schematic sectional view of FIG. 2 shows a further exemplary embodiment of an optoelectronic component 1 described here. In contrast to the exemplary embodiment shown in FIG. 1, the second encapsulation body 6 has a convex shape above the semiconductor chip 2. Thus, the outer surfaces 5, 7 of the first encapsulation body 4 and of the second encapsulation body 6 facing away from the carrier 3 form an optical lens 12, in particular a converging lens, in the first region 8. The curved outer surface 7 of the second encapsulation body is, in this case, formed in a cavity 15 in the second encapsulation body 6.

Figure 3:
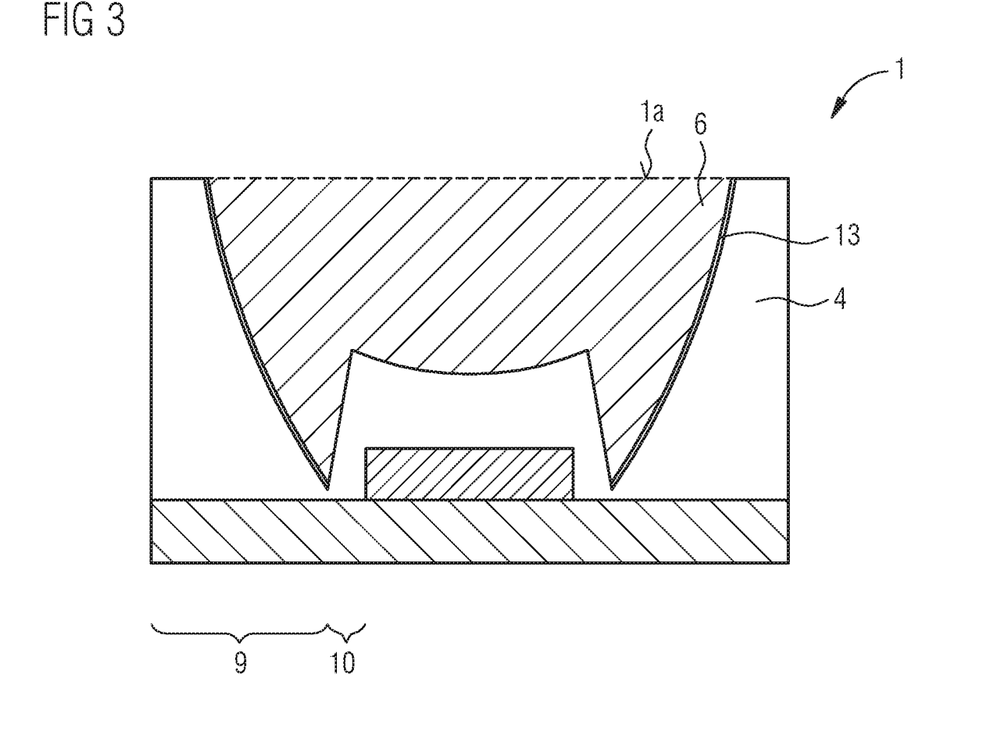

A further design example of an optoelectronic component described here is shown in FIG. 3. In contrast to the design example shown in FIG. 1, the refractive index of the first encapsulation body 1 may be greater than the refractive index of the second encapsulation body 13. A reflector layer 13 is arranged in regions between the first encapsulation body 4 and the second encapsulation body 6 in the second 9 and third 10 region. The emitted radiation is advantageously reflected by the reflector layer 13 and can then exit through the radiation passage surface 1a of the optoelectronic component 1.

Figure 4:
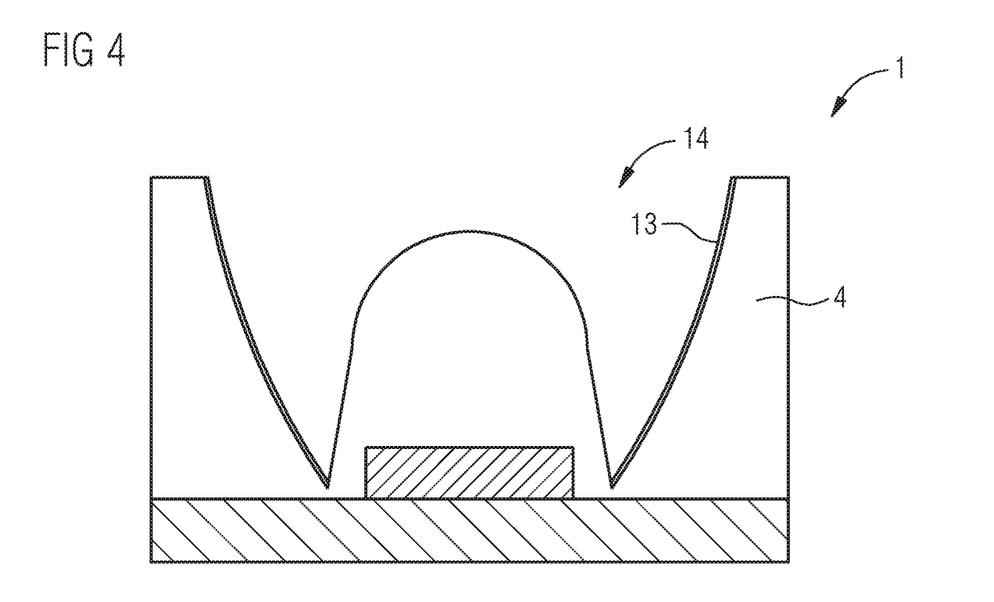

As shown in FIG. 4, in contrast to the design example shown in FIG. 3, an optoelectronic component 1 is illustrated in which the second encapsulation body 6 is formed by a cavity 14 in the first encapsulation body 4. The cavity 14 contains, for example, a gas or gas mixture, such as air. In addition, the first encapsulation body 4 has a convex profile above the semiconductor chip 2.

Figure 5:
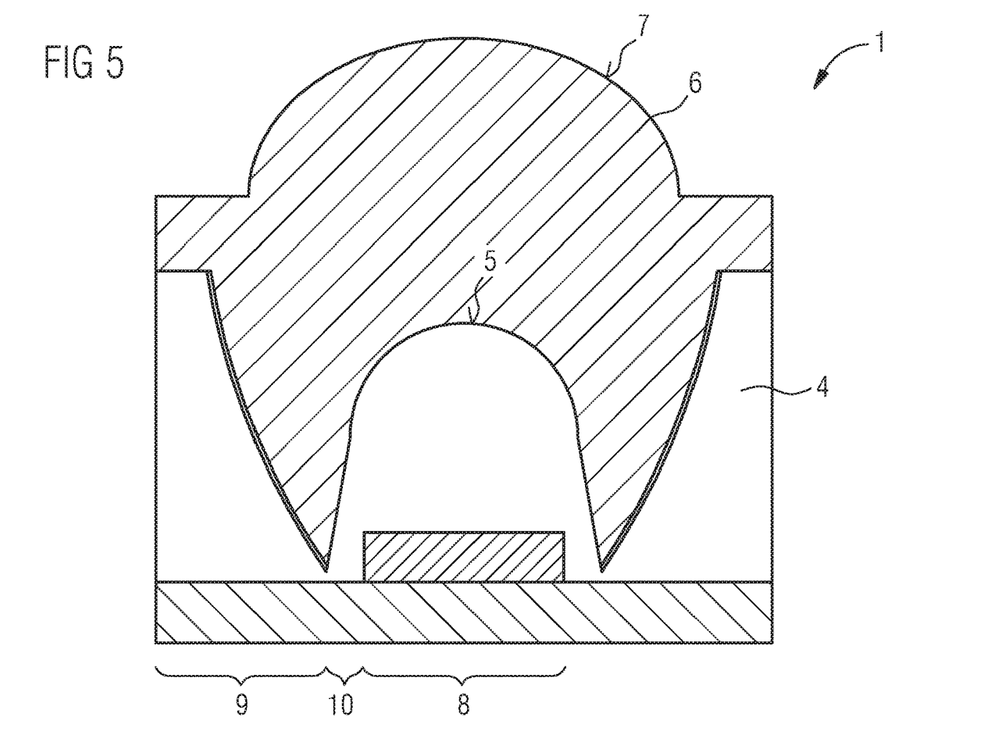

In contrast to the optoelectronic component 1 shown in FIG. 4, the second encapsulation body 6 according to FIG. 5 completely covers the outer surface 5 of the first encapsulation body 4 facing away from the carrier 3. In addition, the outer surface 7 of the second encapsulation body 6 facing away from the carrier 3 has a convex shape above the semiconductor chip 2 which shape projects beyond the first encapsulation body 5 in the vertical direction. Furthermore, the convex shape of the second encapsulation body 6 extends in lateral directions over the first 8, the second 9 and the third 10 region.

Figure 6:
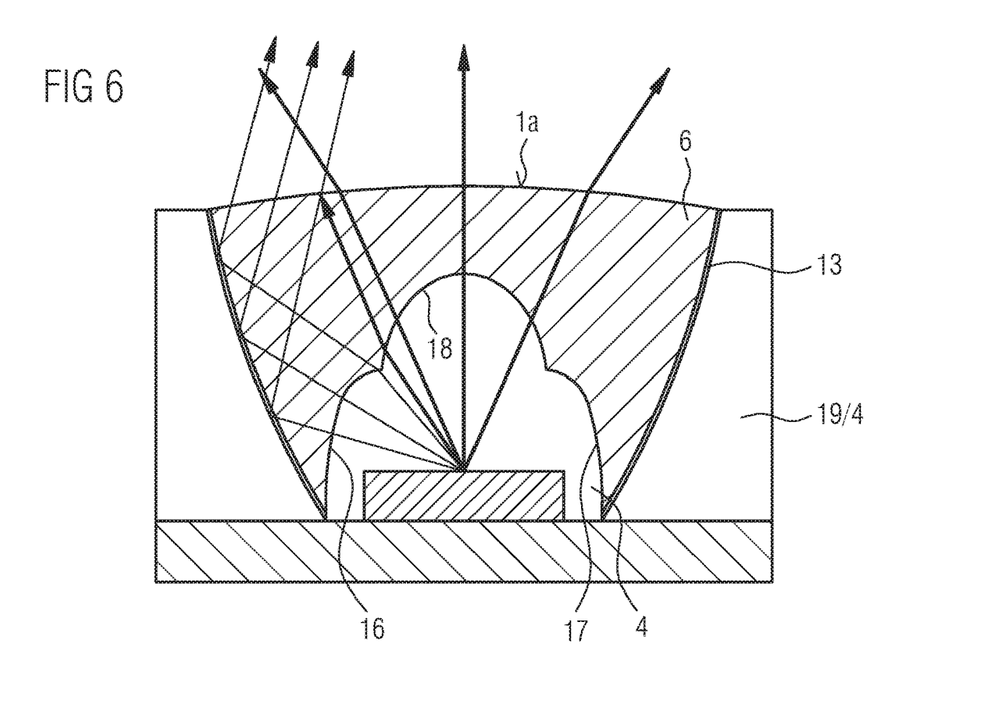

FIG. 6 shows another design example of an optoelectronic component 1. In contrast to the optoelectronic component 1 shown in FIG. 5, the first encapsulation body 4 has a shape formed from three convex regions 16, 17, 18 above the semiconductor chip 2 or in the first region 8. Emitted radiation entering the second encapsulation body 6 through the first and second convex region 16, 17 can be reflected at the reflector layer 13 toward the radiation passage surface 1a. Emitted radiation entering the second encapsulation body 6 through the third convex region 18 is uniformly guided toward the radiation passage surface 1a in correspondence with the curvature of the third convex region 18. Such an arrangement brings about a particularly uniform light extraction through the radiation passage surface 1a.

Figure 7:
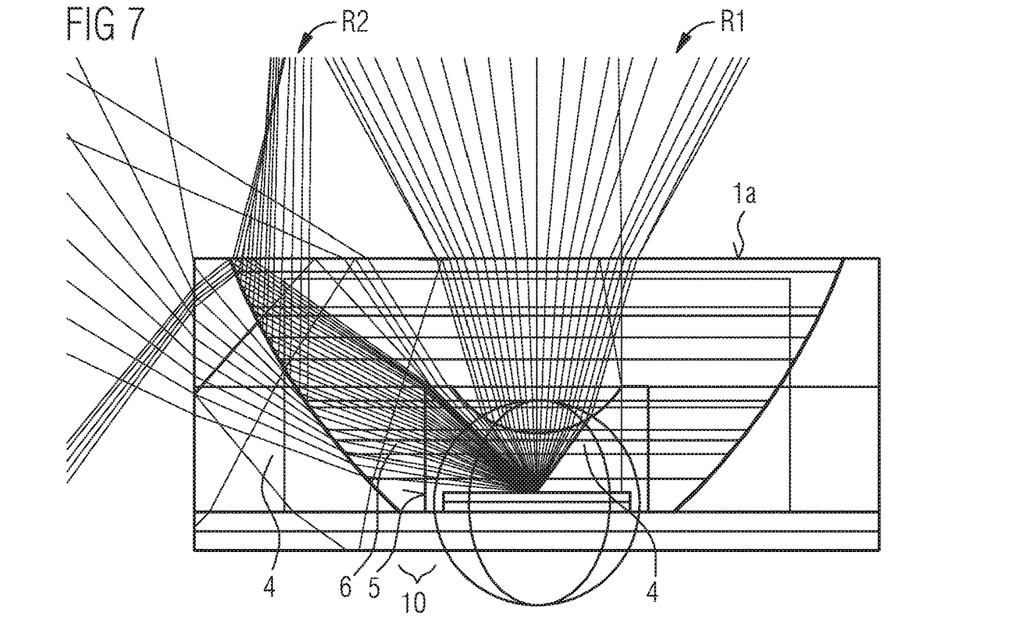

In FIG. 7, an emission of the radiation R1, R2 is also shown schematically on the basis of exemplary beam paths. The semiconductor chip 2 is a surface-emitting semiconductor chip 2 and emits the radiation R1, R2 virtually over a solid angle range of 180°. The optoelectronic component 1 has a width and length of 3.8 mm and a thickness of 1.6 mm. The refractive index of the first encapsulation body 4 is 1.3 and the refractive index of the second encapsulation body 6 is 1.6.

A portion of the first radiation R1 enters the second encapsulation body 6 in the region of the concavely shaped first encapsulation body 4 and is coupled out of the optoelectronic component 1 via the radiation passage surface 1a.

In contrast, the second radiation R2 enters the second encapsulation body 6 via the outer surface 5 of the first encapsulation body 4 in the second region 10. Since the second encapsulation body 6 has a refractive index that is greater than the first encapsulation body 4, a large portion of the second radiation R2 is reflected at the interface of the first and second encapsulation body 4, 6 and directed toward the radiation passage surface 1a.

Figure 8:
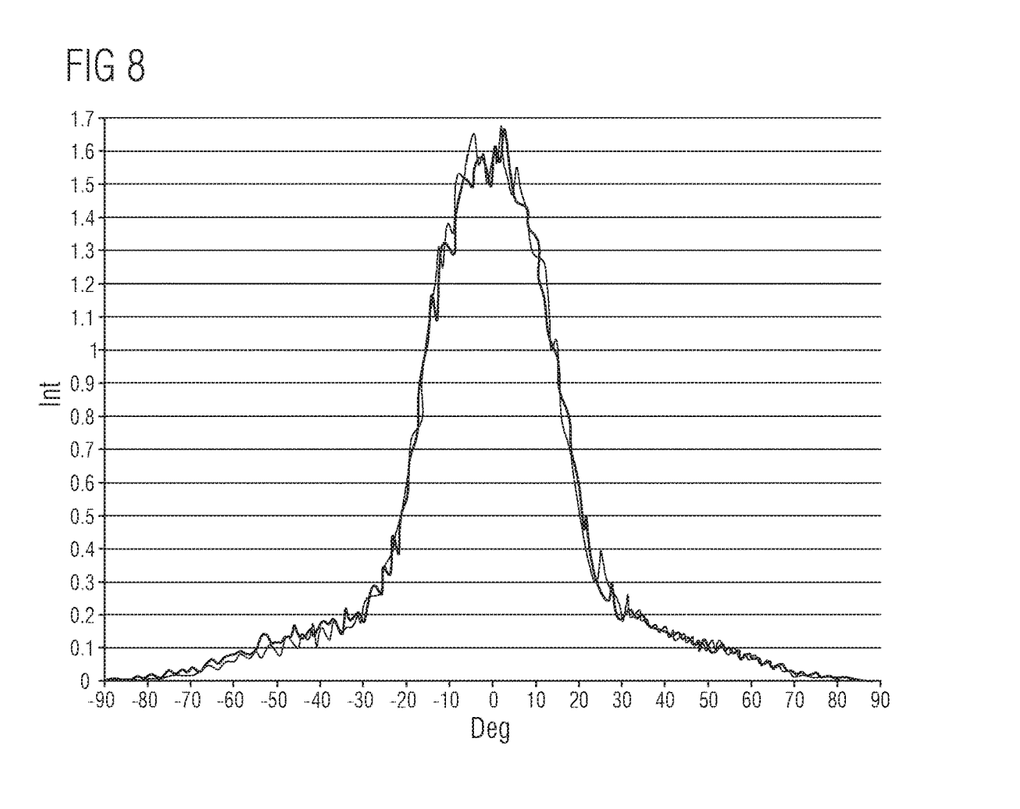

FIG. 8 shows the associated emission characteristic. An intensity Int in arbitrary units is, in this case, plotted against an emission angle Deg in degrees. An emission angle range of the optoelectronic component 1 may have an aperture angle of at least 5°, in particular at least 10°, preferably at least 15°, or particularly preferably at least 25°. Alternatively or additionally, this aperture angle is, for example, at most 100°, preferably at most 80°, or in particular at most 50°. In other words, a directional emission into a small solid angle range is performed by the optoelectronic component 1. For example, at least 80% or preferably at least 90% of the radiation emitted by the optoelectronic component 1 is emitted into said emission angle range.

The invention is not limited to the exemplary embodiments by the description based thereon. Rather, the invention encompasses any novel feature as well as any combination of features, including in particular any combination of features in the claims, even if this feature or combination itself is not explicitly specified in the claims or exemplary embodiments.

LIST OF REFERENCE NUMERALS

1 Optoelectronic component
1a Radiation passage surface
2 Optoelectronic semiconductor chip
3 Carrier
4 First encapsulation body
4a First thickness of the first encapsulation body
4b Second thickness of the first encapsulation body
4c Third thickness of the first encapsulation body
5 Outer surface of the first encapsulation body
6 Second encapsulation body
6a First thickness of the second encapsulation body
6b Second thickness of the second encapsulation body
6c Third thickness of the second encapsulation body
7 Outer surface of the second encapsulation body
8 First region
9 Second region
10 Third region
11 Optical axis
12 Optical lens
13 Reflector layer
14 Cavity of the first encapsulation body
15 Cavity of the second encapsulation body
16 First convex region
17 Second convex region
18 Third convex region
19 Third encapsulation body R1 First radiation
R2 Second radiation

The invention claimed is:

1. Optoelectronic component comprising
   at least one optoelectronic semiconductor chip which is designed to generate or detect electromagnetic radiation,
   a carrier on which the optoelectronic semiconductor chip is arranged,
   a first encapsulation body into which the optoelectronic semiconductor chip is embedded, and
   a second encapsulation body, wherein
   the first encapsulation body has a first thickness above the optoelectronic semiconductor chip and has a second thickness laterally spaced from the optoelectronic semiconductor chip,
   the first thickness is less than the second thickness,
   a third thickness of the first encapsulation body between the first thickness and the second thickness is minimal, and wherein the third thickness is less than a thickness of the optoelectronic semiconductor chip, and
   the second encapsulation body is arranged on the first encapsulation body.

2. The optoelectronic component according to claim 1, wherein the first encapsulation body has a concavely or convexly shaped outer surface above the semiconductor chip.

3. The optoelectronic component according to claim 1, wherein the second encapsulation body is in direct contact with the first encapsulation body in regions.

4. The optoelectronic component according to claim 1, wherein a refractive index of the first encapsulation body is different from the refractive index of the second encapsulation body.

5. The optoelectronic component according to claim 1, wherein the second encapsulation body has a first thickness above the semiconductor chip and has a second thickness laterally spaced from the semiconductor chip, wherein the first thickness is greater than or less than the second thickness, and a third thickness of the second encapsulation body between the first thickness and the second thickness is maximal.

6. The optoelectronic component according to claim 1, wherein the second encapsulation body has a concavely or convexly shaped outer surface above the semiconductor chip.

7. The optoelectronic component according to claim 1, wherein the first encapsulation body and the second encapsulation body form an optical lens above the semiconductor chip.

8. The optoelectronic component according to claim 1, wherein a reflector layer is arranged in regions between the first encapsulation body and the second encapsulation body in the region of the second thickness.

9. The optoelectronic component according to claim 8, wherein the reflector layer comprises metal.

10. The optoelectronic component according to claim 8, wherein the reflector layer is designed to reflect the electromagnetic radiation emitted or to be detected during operation of the optoelectronic semiconductor chip.

11. The optoelectronic component according to claim 1, wherein the first encapsulation body has a shape formed of three convex regions above the optoelectronic semiconductor chip.

12. Method for producing an optoelectronic component according to claim 1, comprising:
    providing the carrier,
    applying the optoelectronic semiconductor chip to the carrier,
    applying the first encapsulation body to the carrier and to the optoelectronic semiconductor chip, and
    applying the second encapsulation body to the first encapsulation body by means of a casting process.

13. The method according to claim 12, wherein a reflector layer is applied in regions to the first encapsulation body before applying the second encapsulation body.

14. The method according to claim 12, wherein a reflector layer is applied by means of electroplating.

15. Optoelectronic component comprising
    at least one optoelectronic semiconductor chip which is designed to generate or detect electromagnetic radiation,
    a carrier on which the optoelectronic semiconductor chip is arranged,
    a first encapsulation body into which the optoelectronic semiconductor chip is embedded, and
    a second encapsulation body, wherein
    the first encapsulation body has a first thickness above the optoelectronic semiconductor chip and has a second thickness laterally spaced from the optoelectronic semiconductor chip,
    the first thickness is less than the second thickness,
    a third thickness of the first encapsulation body between the first thickness and the second thickness is minimal, and
    the second encapsulation body is arranged on the first encapsulation body, wherein the third thickness of the first encapsulation body is less than a thickness of the optoelectronic semiconductor chip and wherein the third thickness is greater than zero.

* * * * *